(12) United States Patent
Kobayashi et al.

(10) Patent No.: US 6,512,458 B1
(45) Date of Patent: Jan. 28, 2003

(54) METHOD AND APPARATUS FOR DETECTING FAILURE IN SOLAR CELL MODULE, AND SOLAR CELL MODULE

(75) Inventors: Takuma Kobayashi, Kyotanabe; Naoki Manabe, Soraku-gun; Nobuyoshi Takehara, Soraku-gun, all of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/286,846

(22) Filed: Apr. 6, 1999

(30) Foreign Application Priority Data

Apr. 8, 1998 (JP) .......................... 10-111339
Apr. 2, 1999 (JP) .......................... 11-096883

(51) Int. Cl.$^7$ .......................... G08B 21/00
(52) U.S. Cl. .................. 340/635; 340/507; 340/870.29
(58) Field of Search ............... 340/870.16, 870.17, 340/635, 636, 664, 660, 661, 662, 663, 501, 507, 513, 514, 870.29

(56) References Cited

U.S. PATENT DOCUMENTS

| | | | | |
|---|---|---|---|---|
| 4,217,541 A | * | 8/1980 | Weintraub et al. | 323/51 |
| 4,417,200 A | * | 11/1983 | Weintraub et al. | 323/347 |
| 5,059,254 A | * | 10/1991 | Yaba et al. | 136/251 |
| 5,302,902 A | * | 4/1994 | Groehl | 324/434 |
| 5,669,987 A | * | 9/1997 | Takehara et al. | 136/244 |
| 5,703,468 A | * | 12/1997 | Petrillo | 320/39 |
| 5,744,936 A | * | 4/1998 | Kawakami | 320/120 |
| 5,909,061 A | * | 6/1999 | Sasaki et al. | 307/44 |

FOREIGN PATENT DOCUMENTS

| | | |
|---|---|---|
| JP | 8-97456 | 4/1996 |
| JP | 9-148613 | 6/1997 |

OTHER PUBLICATIONS

English translation of JP–148613 (published Jun. 6, 1997).

* cited by examiner

*Primary Examiner*—Jeffery A. Hofsass
*Assistant Examiner*—Daniel Previl
(74) *Attorney, Agent, or Firm*—Fitzpatrick, Cella, Harper & Scinto (57) ABSTRACT

The temperature of a bypass diode of a solar cell module is measured by a temperature detector from the exterior of the solar cell module, and the results of temperature detection of each bypass diode are mutually compared to detect the presence or absence of failure in the solar cell module. Also at least one solar cell in the solar cell module is covered with a light shielding plate, then a current flowing in the bypass diode bypassing to the covered solar cell is detected, and a failed solar cell module is detected from the result of the current detection. Also the solar cell module is provided with a temperature detector capable of detecting the temperature of the bypass diode and the temperature of an internal portion of the solar cell module other than the bypass diode. In this way, it is possible to detect a failure in the solar cell module easily and precisely, and also to detect short circuit failure in the solar cell.

19 Claims, 10 Drawing Sheets

METHOD AND APPARATUS FOR DETECTING FAILURE IN SOLAR CELL MODULE, AND SOLAR CELL MODULE

BACKGROUND OF THE INVENTION

1. Field of the Invention

The present invention relates to a method and an apparatus for detecting a failure in a solar cell module in a photovoltaic power generation system, and to a solar cell module.

2. Related Background Art

Because of the recently increased concern for the environmental and energy issues developing in the global scale, the photovoltaic power generation system is attracting attention as a clean energy source. For installation, the solar cell is constructed as a ground installation type for installation on the field or a roof installation type for installation on the house roof, but the latter capable of effectively utilizing the roofs of the houses is mainly used because the installation of solar cells requires a large area. The roof installation type can be principally divided into a type for installation on a support and a type integrated with the roof material, but recently there is increasing the roof material-integrated solar cell module in which solar cells are stacked on a roofing steel plate and which has the function of the roof material.

Figure 2:
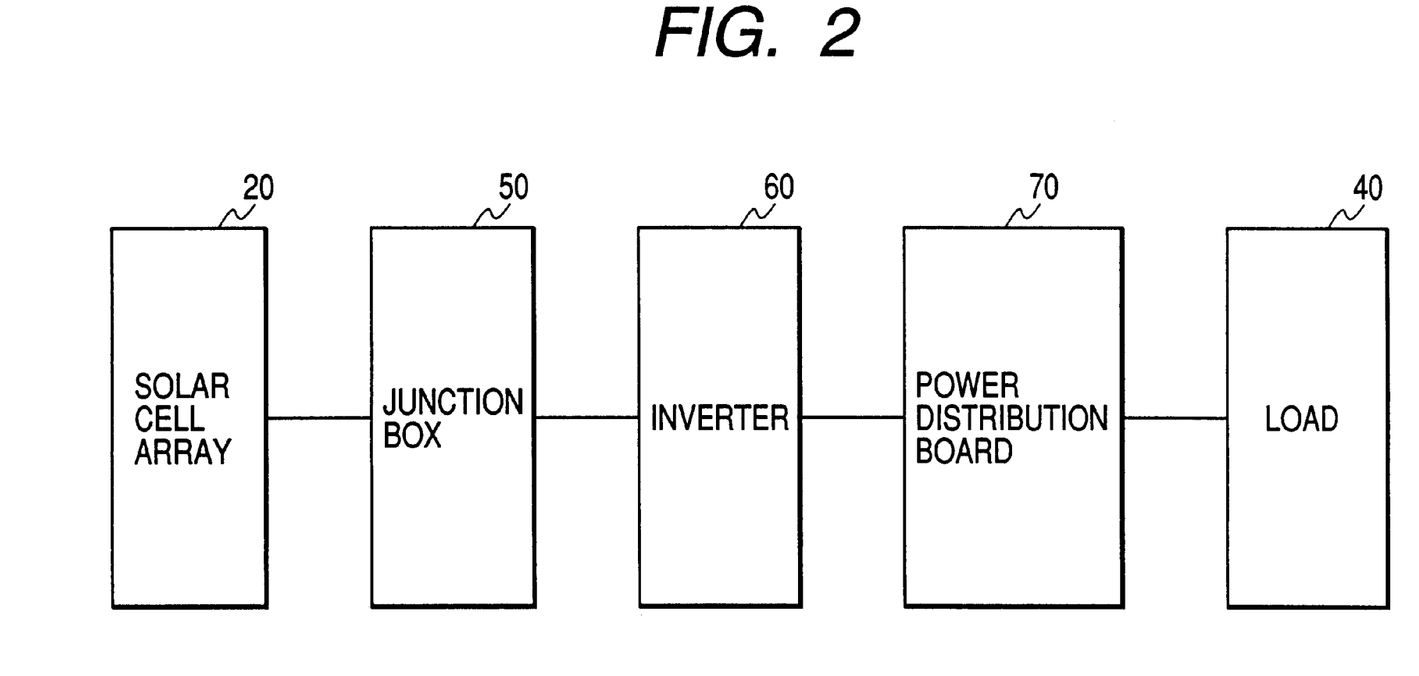
FIG. 2 is a block diagram showing a general photovoltaic power generation system.

In constructing a photovoltaic power generation system, a solar cell array is constructed by understanding the characteristics of the solar cell module and determining the number of series and parallel connections of the solar cells in order to obtain a desired output thereof. FIG. 2 is a block diagram of a general photovoltaic power generation system.

A solar cell array 20 is produced by connecting a plurality of solar cell modules in series to form a string and then by connecting a plurality of strings in parallel. In the photovoltaic power generation system, a direct current from the solar cell array 20 is collected at a junction box 50, then supplied to an inverter 60, and further supplied to a load 40 through a power distribution board 70. In the photovoltaic power generation system for ordinary house, the junction box 50 and the inverter 60 are often installed indoors for facilitating maintenance and inspection. Each solar cell module is provided with a bypass diode, and, in the case of an unbalance in the currents of the solar cell modules, the current bypasses the solar cell module to flow in the diode. In order to achieve the safe and efficient operation of the photovoltaic power generation system, it is essential to exactly detect the failure in the solar cell module.

For detecting a failure in a solar cell module, there are conventionally known, for example, a method of measuring the terminal voltage of solar cell modules with a tester and finding out the solar cell module of a lowered terminal voltage, a method of employing a light emitting diode as a bypass diode provided in a solar cell module and inspecting the light emitting state of the diode as disclosed in Japanese Patent Laid-Open No. 8-97456, and a method of providing means for changing color by a current flowing in a bypass diode of the solar cell module, in a solar cell module, as disclosed in Japanese Patent Laid-Open No. 9-148613.

However, in the above-mentioned method of measuring the terminal voltage of the solar cell, it is necessary to measure the terminal voltage of each solar cell module with a voltage detecting device such as a tester, and such measurement is very difficult particularly in the case the solar cell module is installed on the roof, because the wirings of the solar cell module are usually formed on the back face thereof.

Also in the method of detecting a failed solar cell module by employing a light emitting diode as the bypass diode provided in the solar cell module as disclosed in Japanese Patent Laid-Open No. 8-97456, a current flows in the light emitting diode even in a partial shade state in which the solar cell module is partially shaded, whereby the light emitting diode is turned on. Also the forward voltage drop of the light emitting diode is much larger than that in the ordinary diode. Therefore, the light emitting diode generates a large loss and wastes a precious power generated in the solar cell.

Furthermore, in Japanese Patent Laid-Open No. 9-148613, a current flowing in the bypass diode of the solar cell module is detected by a color changing member incorporated in the solar cell module and capable of changing color by a temperature change, and a failure in the solar cell module is found out by inspecting a color change in a single color changing member. However, the temperature of the solar cell module may rise to about 80° C. under the strong solar radiation energy in the mid summer time, and it is impossible to find out a failure in the solar cell module by merely observing a color change in a single color changing member, in consideration of a case where a temperature rises to 80° C. in the bypass diode connected to a normal solar cell module in summer and a case where a temperature rises to 80° C. in the bypass diode by a failure in the solar cell module.

Also among the failures of the solar cell, there is known short circuit failure caused by the short circuit of the solar cell. In the solar cell with the short circuit failure, no current flows in the bypass diode, so that the short circuit failure cannot be detected solely by the conventional method of detecting a current flowing in the bypass diode.

SUMMARY OF THE INVENTION

An object of the present invention is to provide a method and an apparatus for detecting a failure in a solar cell module, and a solar cell module which allow to easily detect the failure in the solar cell module even when it is installed on a roof. Another object of the present invention is to enable exact detection of the failure in the solar cell module even in the case of employing the color changing member incorporated in the solar cell module and capable of changing color by a temperature change. Still another object of the present invention is to enable easy detection of the short circuit failure of the solar cell module.

In order to attain the above-mentioned objects, the method of the present invention of detecting a failure in a solar cell module comprises detecting the temperature of a bypass diode of the solar cell module from the exterior of the solar cell module and detecting the presence or absence of the failure therein based on the result of the temperature detection. Also the apparatus of the present invention for detecting a failure in a solar cell module comprises a temperature detecting means for detecting the temperature of a bypass diode of the solar cell module from the exterior of the solar cell module.

Thus, when the solar cell module is installed, for example, on the roof, the failure in the solar cell module can be easily detected from the top side thereof even if the solar cell module does not have the temperature detecting means therein.

Also, another method of the present invention of detecting a failure in the solar cell module comprises covering at least one solar cell in the solar cell module with a light shielding plate, detecting a current in a bypass diode bypassing the covered solar cell, and detecting the failed solar cell module based on the result of the current detection. Further, another apparatus of the present invention for detecting a failure in a solar cell module comprises a light shielding plate for covering the solar cell module or a solar cell, a current detection means for detecting a current in a bypass diode bypassing the solar cell module or the solar cell, and means for detecting a failed solar cell module based on the output from the current detection means.

It is thus possible to easily and exactly detect the solar cell module with a short circuit failure by utilizing a current flowed in the bypass diode when a normal solar cell module or a normal solar cell is shielded from light.

Further, the solar cell module of the present invention comprises a temperature detection means provided in the exterior of the solar cell module and capable of detecting the temperature of a bypass diode therein and the temperature of an interior of the solar cell module other than the diode.

When there is employed a color charging member incorporated in the solar cell module and capable of changing color by the temperature change, the temperature of a bypass diode can be evaluated in relative comparison with the temperature in the surrounding solar cell module under a similar environment, whereby the failure in the solar cell module can be accurately detected.

Furthermore, the solar cell module of the present invention comprises, in the vicinity of the bypass diode, means for preventing the temperature rise of a bypass diode resulting from a cause other than a current.

By employing this module and measuring the temperature rise in the bypass diode with the above-described method, it is possible to avoid the difficulty in the failure detection resulting from a fact that the bypass diode becomes excessively heated, for example, by the direct sunshine and the specific heat generated by the bypass diode itself can not be discriminated.

DESCRIPTION OF THE PREFERRED EMBODIMENTS

In a preferred embodiment of the method and apparatus of the present invention for detecting a failure in a solar cell module, the presence or absence of the failure in the solar cell module is detected by mutual comparison of the results of temperature detection in each bypass diode.

Specifically, in the case of breaking of a wire in a solar cell 1 among solar cells constituting a solar cell module 10, a current does not flow in the failed solar cell 1 but in a bypass diode 15 bypassing the solar cell 1. This failure is called an open circuit failure. In such state, the bypass diode 15 in which a current flows shows a temperature rise in comparison with other bypass diodes 15 in which a current does not flow.

Figure 1:
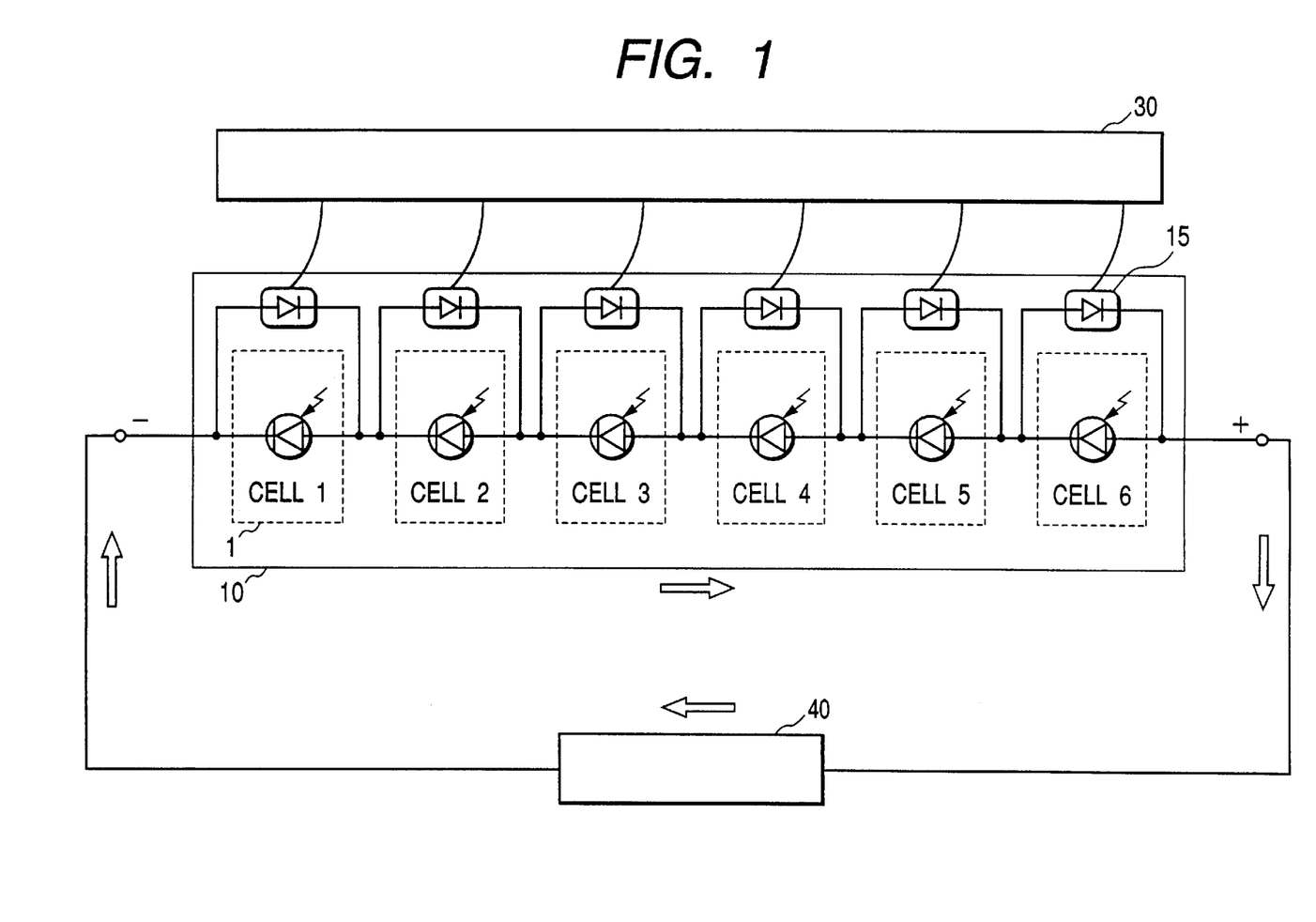
FIG. 1 is a constitutional diagram illustrating a method of detecting a failed solar cell module according to Example 1 of the present invention.

It is therefore possible to search the module 10 including the bypass diode in which a current flows, that is, the solar cell 1 in the open circuit failure state, by detecting the temperature of the bypass diodes 15 in the solar cell module 10 from the exterior of the module by use of a failure detecting apparatus provided with a temperature detecting means 30 as shown in FIG. 1 and by executing relative comparison of the temperature difference between the bypass diode 15 of the normal solar cell 1 and the bypass diode 15 of the failed solar cell 1. This search may however become difficult when the temperature of the bypass diode 15 becomes excessively high, for example, by direct sunlight. Therefore, in the solar cell module of the present invention, the bypass diode 15 may be provided in the vicinity thereof with means for preventing a temperature rise generated from any cause other than a current. Specifically, the bypass diode 15 may be covered with a light shielding member such as a reflecting plate, or surrounded by a heat insulating material. The failure detecting apparatus as shown in FIG. 1 can be applied to the failure detection of this module.

Also in an embodiment of another method and apparatus of the present invention for detecting a failure in a solar cell module, a current flowing in the bypass diode bypassing a solar cell covered with a light shielding plate is detected either by detecting a magnetic force generated by the current, or by a light emitting member which emits light by the current, or by detecting the temperature of the bypass diode and/or solar cell of the solar cell module.

Figure 4:
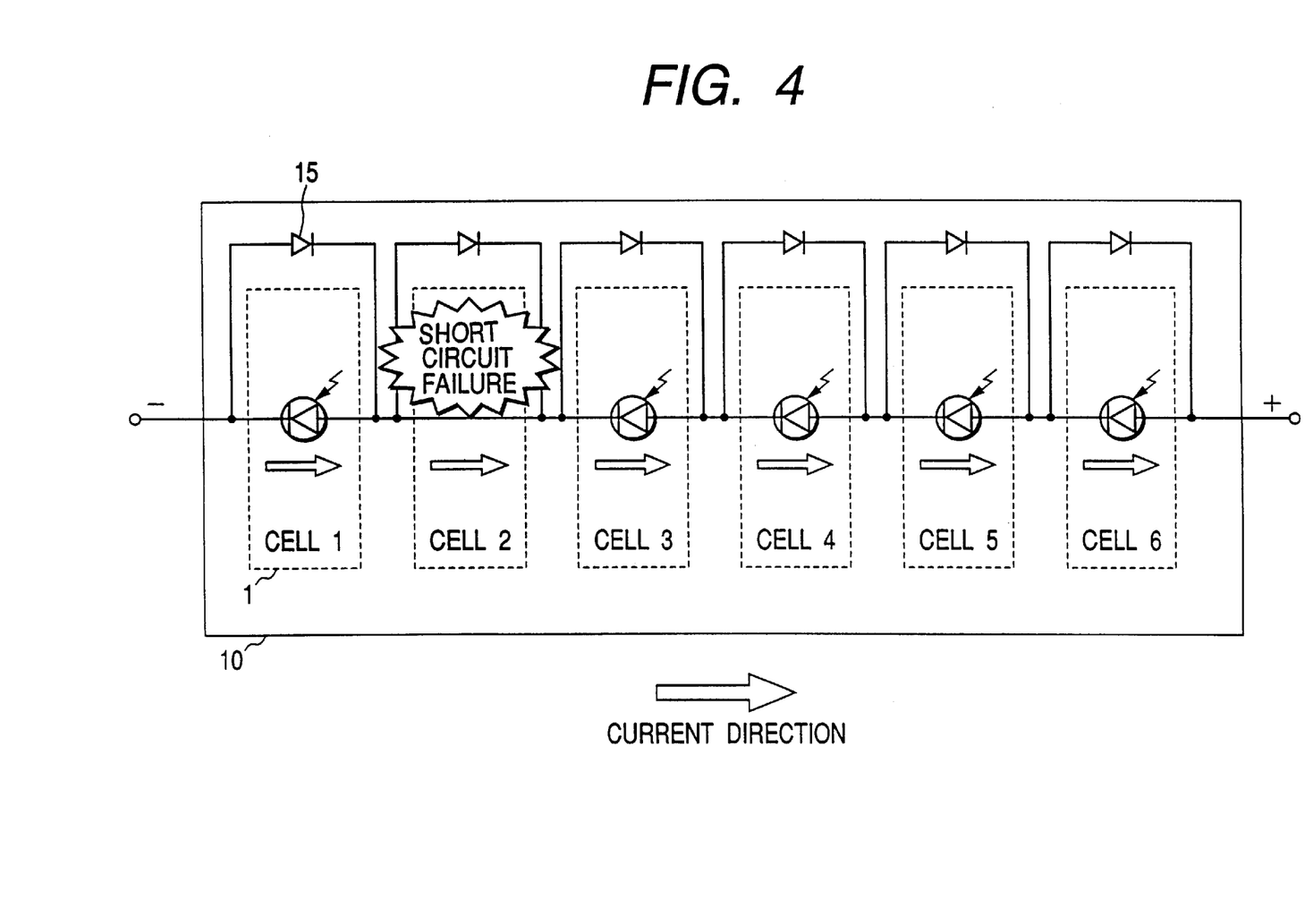
FIG. 4 is a diagram illustrating the principle of another method of the present invention of a failed solar cell module.
Figure 5:
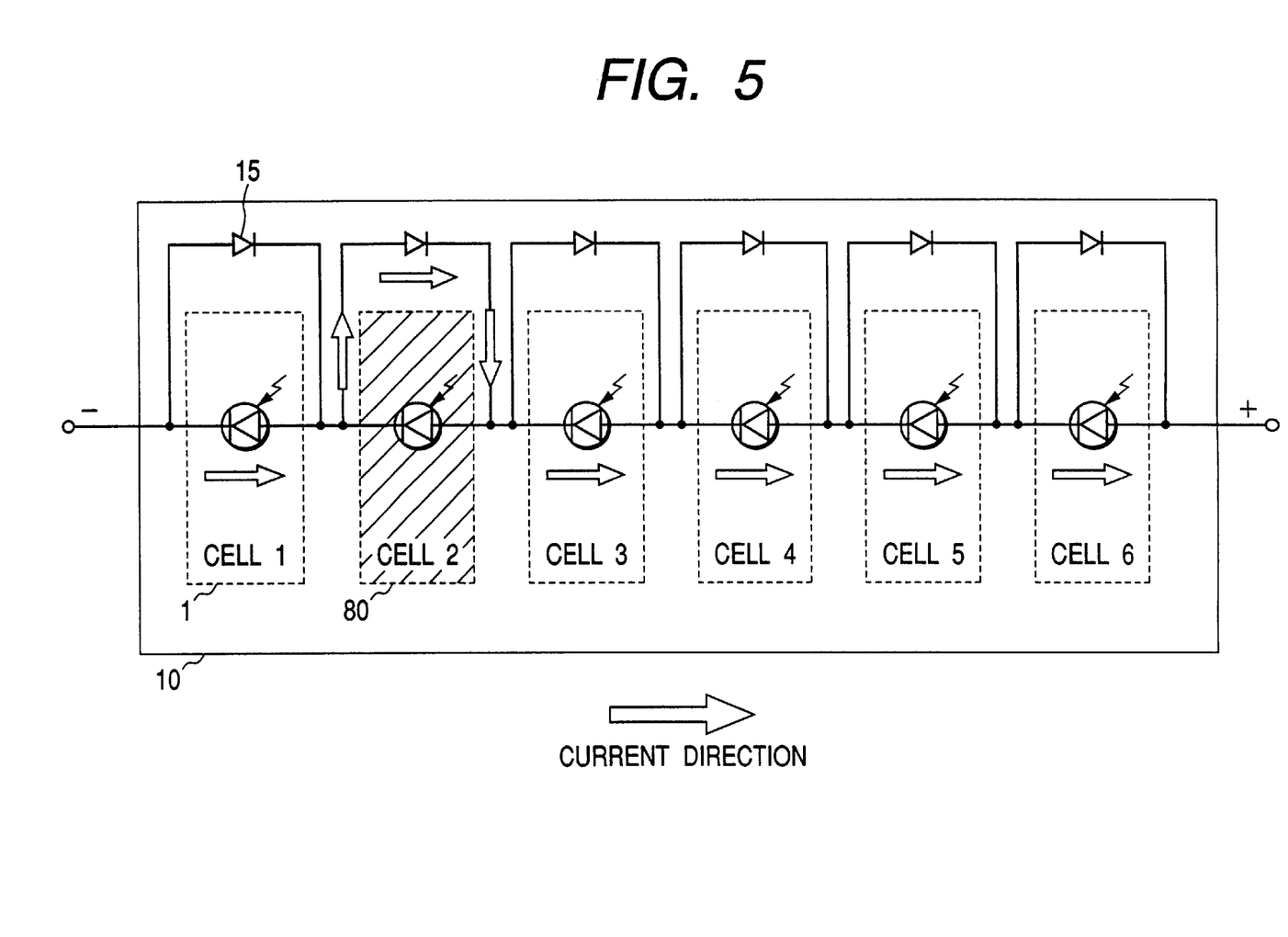
FIG. 5 is a diagram illustrating another principle of another method of the present invention of detecting a failed solar cell module.
Figure 6:
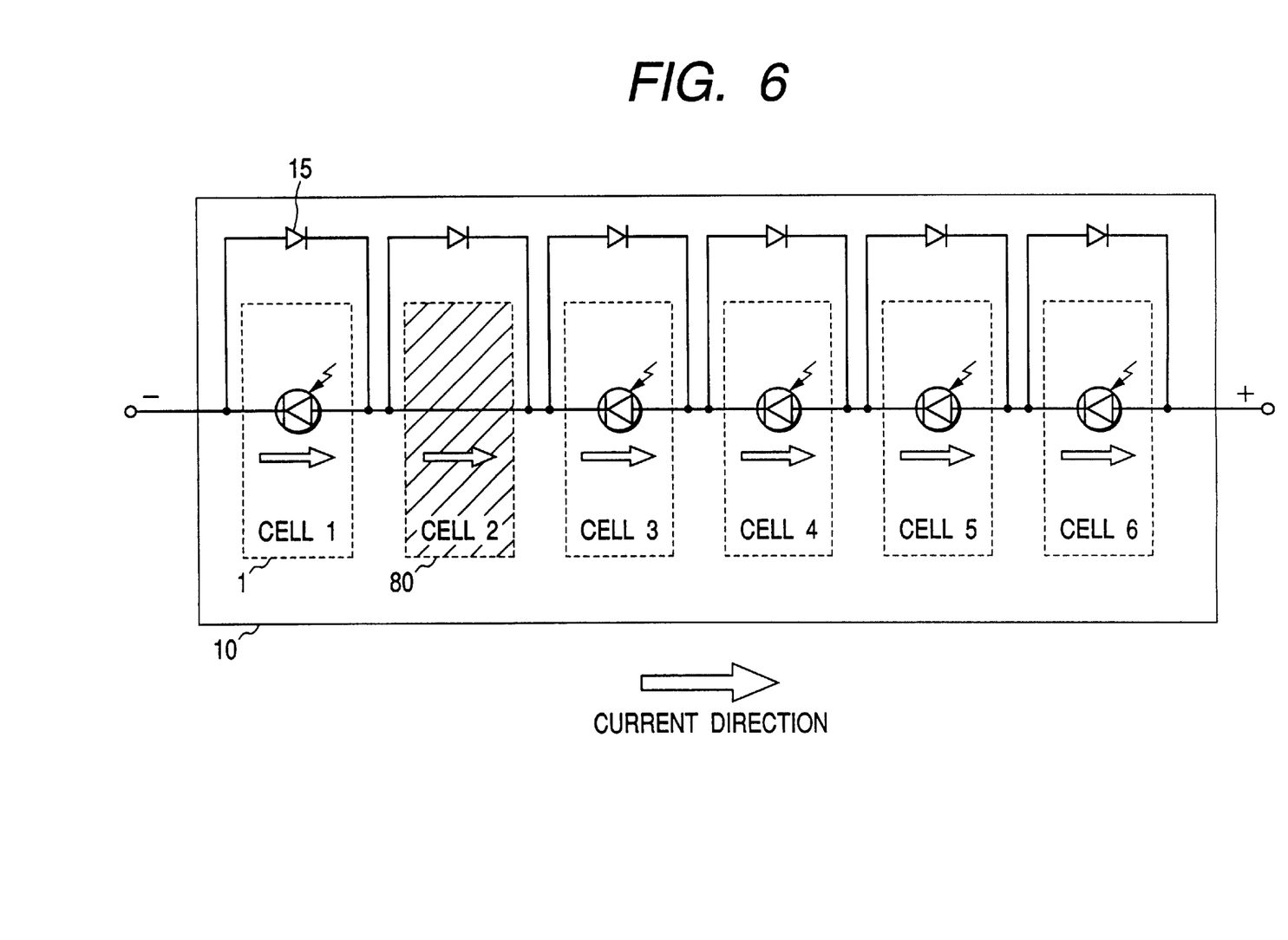
FIG. 6 is a diagram illustrating still another principle of another method of the present invention of detecting a failed solar cell module.

More specifically, in the case where a solar cell 1 generates electric conduction (called a short circuit failure) as shown in FIG. 4, a current flows in the failed solar cell similarly to the normal one, so that the failure cannot be easily detected. In such case, the solar cells 1 are covered one by one with a light shielding plate. A normal solar cell 1 covered with the light shielding plate functions as a diode connected in the inverse direction, so that a current cannot flow in such solar cell. Consequently, as shown in FIG. 5, a current flows in the bypass diode 15 connected to such normal solar cell covered with the light shielding plate 80. On the other hand, a current can flow in the solar cell 1 with a short circuit failure as shown in FIG. 6, even when it is covered with the light shielding plate 80. It is therefore possible to search the failed solar cell 1 with the short circuit failure, by covering the solar cells 1 one by one with a light shielding plate 80 and detecting a solar cell 1 having the bypass diode 15 in which a current does not flow.

Figure 3:
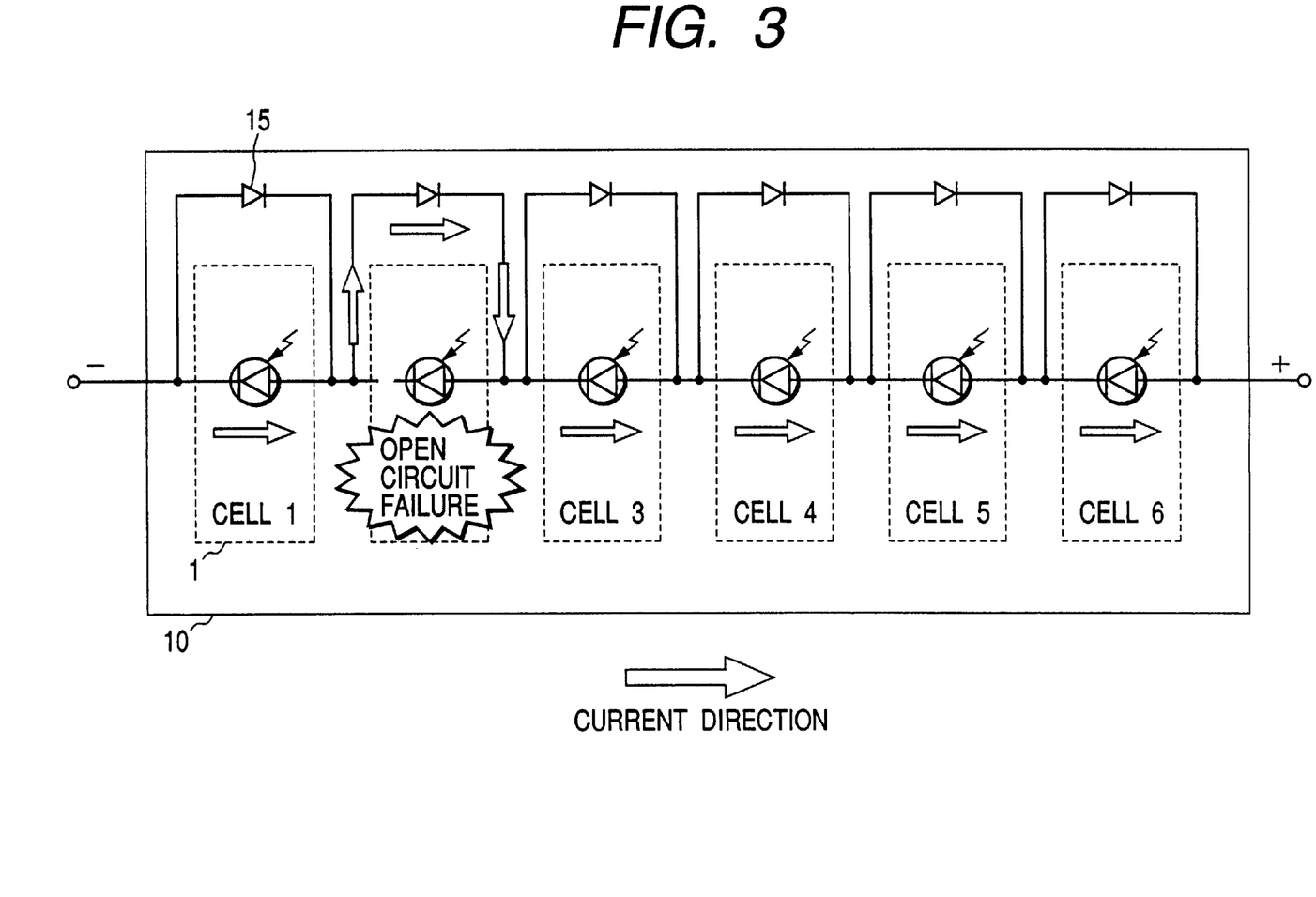
FIG. 3 is a diagram illustrating the principle of one method of the present invention of detecting a failed solar cell module.

The temperature detection of the solar cell 1 in the embodiments shown in FIGS. 3 and 5 to 6 may be executed by a temperature detecting means of non-contact type or contact type. Also as the temperature detection means, there may be used a visual temperature detection means employing a color changing member capable of reversibly changing color by a temperature change. However, there is preferred a thermometer which shows a concrete temperature value since the failure can be more exactly detected.

In another preferred embodiment, the solar cell module of the present invention is provided with a temperature detection means capable of simultaneously detecting the temperature of the bypass diode and the temperature of the interior of the solar cell other than the bypass diode. As the temperature detection means, there can be used a visual temperature detection means, for example, a color changing member showing a reversible color change by a change in the temperature. Thus, by merely looking at the color of the color changing member provided in advance in the interior of the solar cell module, the presence or absence of a current flowing in the bypass diode can be readily understood, so that the presence of a failure in the solar cell module can be extremely easily judged.

EXAMPLE 1

Figure 7:
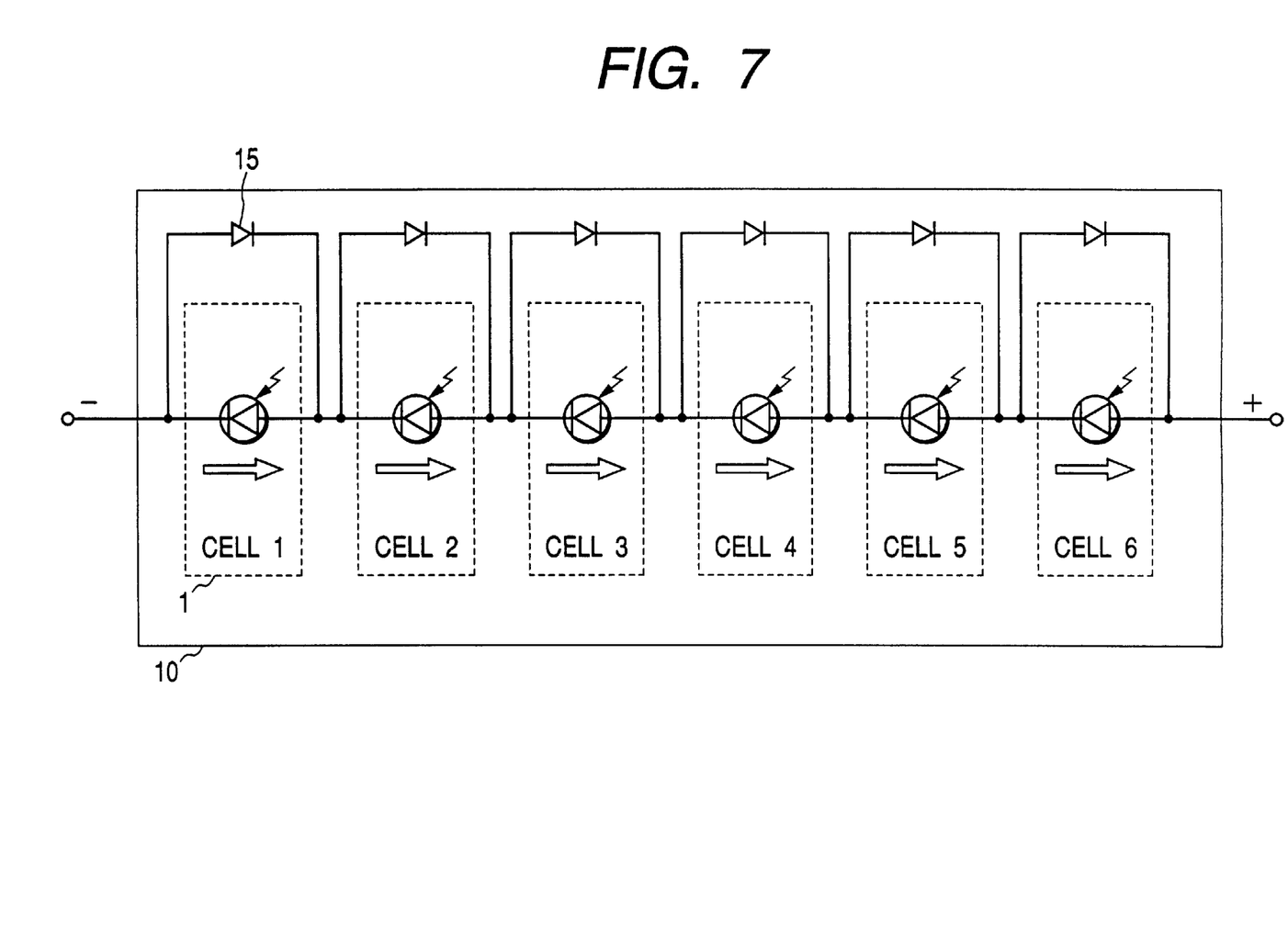
FIG. 7 is a diagram illustrating a solar cell module (amorphous silicon solar cell SR-03 manufactured by CANON) employed in the configuration shown in FIG. 1.

FIG. 1 is a constitutional diagram illustrating the method of detecting a failure in the solar cell module according to Example 1 of the present invention. FIG. 7 shows a solar cell module (amorphous silicon solar cell SR-03 manufactured by CANON) integrated with a construction material. As shown in these drawings, a solar cell module 10 is composed of six solar cells 1 connected in series, and a bypass diode 15 is connected to each of the solar cells 1.

As shown in FIG. 1, a load 40 was connected to the solar cell module 10 in which one of six solar cells 1 had an open circuit failure, and the temperature of the bypass diode 15 connected to each of the solar cells 1 was measured with a temperature detection means 30, specifically a radiation thermometer. At this measurement, the solar radiation energy was 0.9 kW/m$^2$, and the generated current was 2.5 A. The measured temperatures of the bypass diodes 15 are shown in Table 1.

TABLE 1

| Solar cell No. | 1 | 2 | 3 | 4 | 5 | 6 |
|---|---|---|---|---|---|---|
| Bypass diode temp. (° C.) | 53 | 92 | 53 | 52 | 53 | 53 |

In comparison with the temperatures of the bypass diodes 15, it is found that the temperature of the bypass diode 15 connected to the second solar cell 1 is higher by about 40° C. than the temperature of other bypass diodes 15. It can therefore be found out that a current flows in such bypass diode 15, namely that the second solar cell 1 has an open circuit failure.

In this example, the failure in the solar cell 1 could be relatively easily detected because the bypass diode 15 in which a current flowed showed a larger temperature rise by about 40° C. than that of other bypass diodes 15 in which a current did not flow, but the magnitude of such temperature rise may vary depending on the situation. However, such magnitude of the temperature rise can be easily calculated, for example, from the magnitude of a current flowing in the bypass diode 15, the heat resistance and heat radiation area of the bypass diode 15. It is also effective to provide the aforementioned means for preventing the temperature rise.

As explained in the foregoing, it is possible to find out the failed solar cell 1 by measuring the temperature of each bypass diode 15 and comparing the measured temperatures of the bypass diodes with one another.

EXAMPLE 2

In the following there will be explained Example 2 in which the present invention is executed under a high temperature environment.

In this example, there was employed the solar cell module used in Example 1, in which one solar cell had an open circuit failure. The solar cell module was placed in an environmental test chamber set at 70° C., and was irradiated with an artificial solar light from a metal halide lamp, instead of the sunlight.

The solar cell module was connected to a load, and the temperature of the bypass diode connected to each solar cell was measured with a radiation thermometer.

At the measurement, the temperature of the solar cell module was 91° C., the solar irradiation energy was 0.7 kW/m$^2$, and the generated current was 2.0 A. The measured temperatures of the bypass diodes 15 are shown in Table 2.

TABLE 2

| Solar cell No. | 1 | 2 | 3 | 4 | 5 | 6 |
|---|---|---|---|---|---|---|
| Bypass diode temp. (° C.) | 93 | 124 | 93 | 92 | 94 | 93 |

In comparison with the temperatures of the bypass diodes, it is found that the temperature of the bypass diode 15 connected to the second solar cell 1 is higher by about 30° C. than the temperature of other bypass diodes.

It can therefore be found that a current flows in the bypass diode connected to the second solar cell, namely that the second solar cell has an open circuit failure.

As explained in the foregoing, the bypass diode in which a current flows is higher in temperature rise than other bypass diodes in which a current does not flow even at a high temperature, so that it is rendered possible, regardless of the external temperature, to search the failed solar cell by measuring the temperature of each bypass diode and comparing the measured temperatures of the bypass diodes with one another.

EXAMPLE 3

Figure 8:
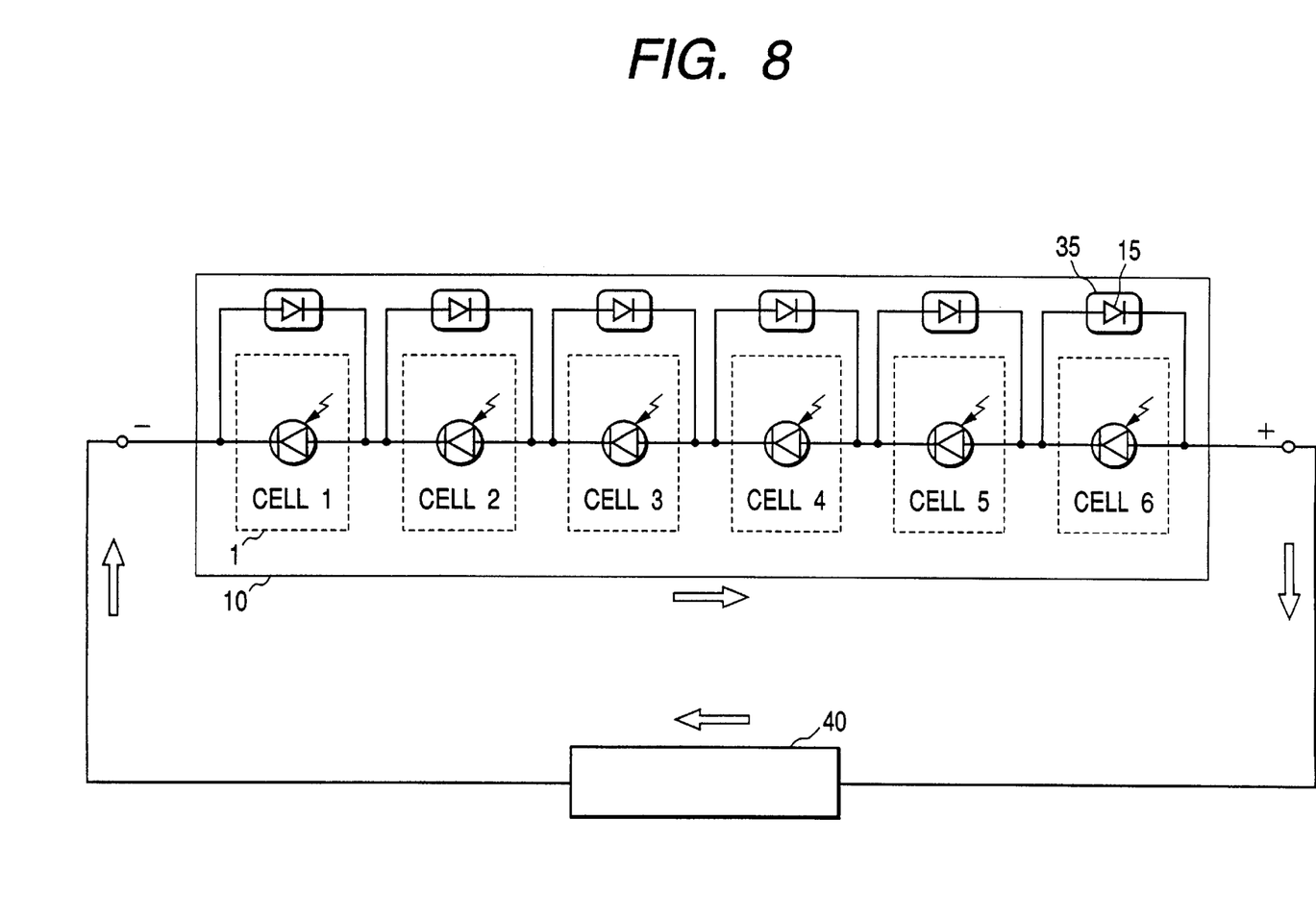
FIG. 8 is a diagram illustrating a method of detecting a failed solar cell module according to Example 3 of the present invention.

FIG. 8 is a diagram illustrating the method of detecting a failure in a solar cell module according to Example 3 of the present invention. This example employed an amorphous silicon solar cell SR-03 manufactured by CANON in which one solar cell had an open circuit failure similarly to Example 1. As shown in FIG. 8, a load 40 was connected to the solar cell module 10. As the temperature detecting means on the bypass diode 15 connected to each solar cell 1, a thermotape (manufactured by Nichiyu Giken Kogyo Co., Ltd.) 35 of a size of 1 cm×1 cm was adhered onto the surface of the solar cell module 10 as temperature detection means. The thermotape 35 shows a color change by a change in the temperature, and this example employed a thermotape TR-70 which showed a reversible color change from red to brownish purple at 70° C. At the measurement, the solar radiation energy was 0.8 kW/m$^2$, and the generated current was 2.3 A. In the observation of the color of the thermotapes 35 attached to the bypass diodes 15, five thermotapes 35 remained unchanged in red color, but the thermotape 35 on the bypass diode 15 connected to the second solar cell showed a color change from red to brownish purple. It could therefore be found that a current flowed in such bypass diode 15, namely that the second solar cell 1 had an open circuit failure.

As explained in the foregoing, it is possible to visually detect the failure in the solar cell module by measuring the temperature of each bypass diode 15 with the temperature detecting means showing a color change by a change in the temperature, such as the thermotape 35.

In the photovoltaic power generation system for the ordinary house, the junction box, the inverter and the like are often installed in the attic so that it is difficult to electrically detect the failure in the solar cell module. The constitution of the present example allows however to easily detect the failure in the solar cell module.

The present example employed the thermotape as the temperature detection means which shows a color change in response to the change in temperature, but there may also be employed a thermolabel, a thermosheet, a thermopaint or a thermocrayon (all manufactured by Nichiyu Giken Kogyo Co., Ltd.) which is prepared by forming a paint showing a color change in response to a temperature change into a label, a sheet, paint or a crayon. However, the color changing member is preferably capable of reversibly changing color, since a current flows in the bypass diode 15 connected to the solar cell 1 which is in a partial shade state (namely in a state of the solar cell shaded from the sunlight).

In the present example, the theromtape capable of changing color at 70° C. was used, but it is possible to execute the temperature measurement under various conditions, for example, by using a piece of a theromtape capable of changing color at 50° C., 60° C., 70° C., 80° C., 90° C. and 100° C. by multistage.

In the present example, the temperature of the bypass diode 15 can be measured from the surface of the solar cell module 10, because it employs an extremely thin resin as the surface protecting material.

EXAMPLE 4

Figure 9:
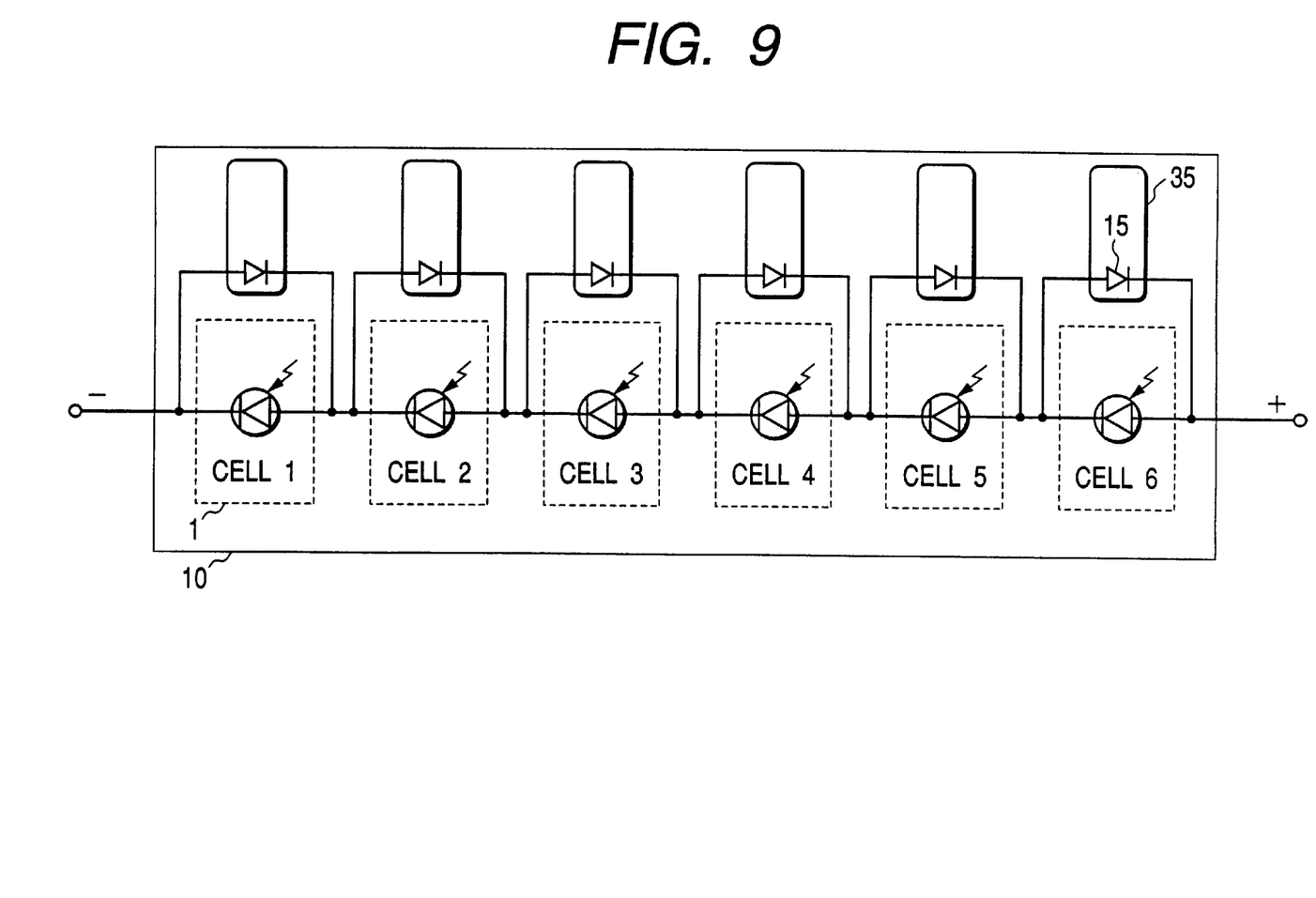
FIG. 9 is a diagram illustrating a solar cell module with a temperature detection means in the interior of the module according to Example 4 of the present invention.

FIG. 9 is a diagram illustrating the constitution of a solar cell module according to Example 4 of the present invention. As shown in FIG. 9, this example employs a solar cell module 10 provided with a temperature detection means in the interior thereof. The solar cell module 10 is featured by employing, as the temperature detection means, a thermotape 35 which is arranged so as to measure the temperature of the bypass diode 15 in the solar cell module 10 and the temperature of a portion of the module 10 other than bypass diode 15.

Generally, the surface temperature of the solar cell module 10 is substantially the same under the same solar irradiation energy. However, when a current flows in the bypass diode 15 by an open circuit failure in the solar cell module 10, the temperature of such bypass diode becomes higher than that in other portion of the solar cell module 10. Consequently, in the thermotape 35 provided in an area containing such bypass diode 15, a portion thereof positioned on the bypass diode 15 changes color in comparison with other portion.

Instead of relative comparison of the temperature of other bypass diodes, it is therefore possible to judge whether a current flows in the bypass diode 15 and to search the failed solar cell 1, in relative comparison of the temperature of the bypass diode 15 with the temperature of a vicinity thereof subjected to the same solar radiation energy as that exposed to the bypass diode 15.

This example is particularly effective when one bypass diode is connected to each solar cell module and the relative comparison of the temperature of the bypass diodes can not be executed.

EXAMPLE 5

Figure 10:
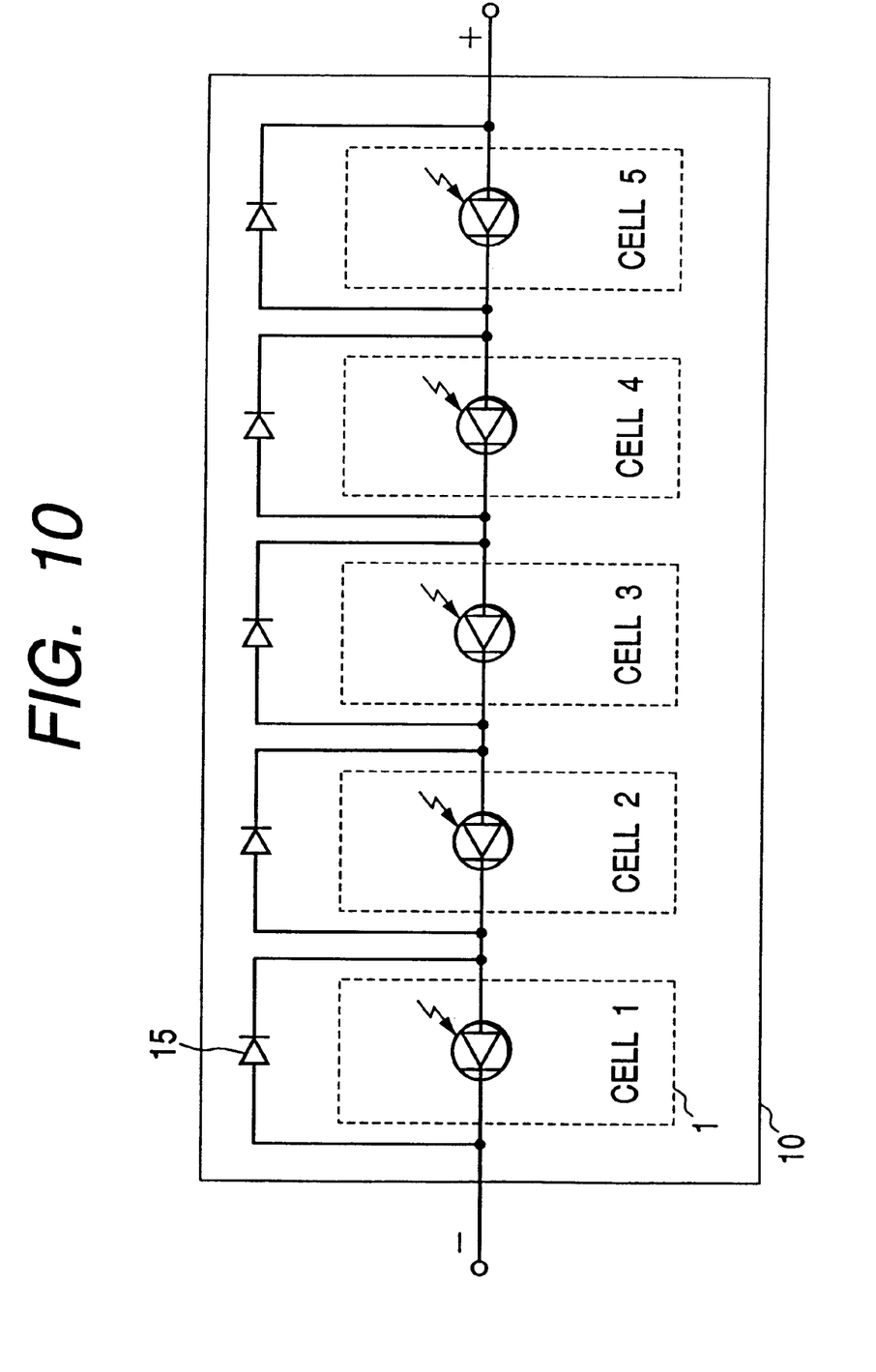
FIG. 10 is a diagram illustrating a solar cell module (amorphous silicon solar cell BS-04 manufactured by CANON) according to Example 5 of the present invention.

FIG. 10 shows a construction material-integrated solar cell module (amorphous silicon solar cell BS-04 manufactured by CANON), according to Example 5 of the present invention. A solar cell module 10 is composed of five solar cells 10 connected in series, a bypass diode 15 is connected to each of the solar cells 1. This example employed the solar cell module 10 in which one of the five solar cells 1 had a short circuit failure. A load was connected to the solar cell module 10, and the temperature of the bypass diode 15 connected to each of the solar cells was measured with a radiation thermometer. At the measurement, the solar radiation energy was 0.7 kW/m$^2$, and the generated current was 3.5 A. Table 3 shows the measured temperatures of the bypass diodes 15.

TABLE 3

| Solar cell No. | 1 | 2 | 3 | 4 | 5 |
|---|---|---|---|---|---|
| Bypass diode temp. (° C.) | 47 | 46 | 46 | 47 | 47 |

As seen from Table 3, the solar cell module 10 with the short circuit failure cannot be detected by measuring the temperature of the bypass diode 15.

Then the solar cells 1 within the solar cell module 10 were covered one by one with a light shielding plate and the temperature of each bypass diode 15 covered was measured with a radiation thermometer.

Table 4 shows the measured temperatures of the bypass diodes 15.

TABLE 4

| Solar cell No. | 1 | 2 | 3 | 4 | 5 |
|---|---|---|---|---|---|
| Bypass diode temp. (° C.) | 95 | 97 | 95 | 48 | 95 |

As shown in this table, the comparison of the temperatures of the bypass diodes 15 indicates the absence of a current flowing in the bypass diode 15 of the fourth solar cell, thereby searching the short circuit failure in the fourth solar cell 1.

In this manner, it is possible to judge whether the solar cell 1 has a short circuit failure, by covering the solar cells 1 one by one with the light shielding plate and successively measuring the temperatures of the bypass diodes 1.

In this example, the solar cells 1 were covered one by one with the light shielding plate, but it is also possible to cover a plurality of solar cells at the same time with the light shielding plate, as long as there can be secured a solar cell in a power generating state capable of supplying a current to the bypass diodes 15. Also when a plurality of solar cell modules 10 are connected in series, it is also possible to execute the measurement by covering all the solar cells 1 within a single solar cell module 10 at the same time.

Furthermore, the present example employed the solar cell module 10 in which one bypass diode 15 is connected to each solar cell 1, but the present example is likewise applicable to a case in which one bypass diode is connected to a plurality of solar cells 1 or a case in which a bypass diode is connected to a plurality of solar cell modules 10.

Also, in the present example, it is important to cover the solar cell 1 with the light shielding plate 80 and search the short circuit failure in the solar cell 1 by judging whether a current flows in the covered solar cell. Therefore, for detecting the presence of the current flowing in the bypass diode 15, there may be employed the aforementioned current detecting method by turning on the light emitting diode as disclosed in Japanese Patent Laid-Open No. 8-97456 in addition to the method of detecting the temperature rise in the bypass diode 15 as explained in the present example, and there can also be applied various other methods.

Also, if the connected bypass diode is in failure when the solar cell 1 is covered with the light shielding plate 80, an inverse voltage is applied to the solar cell 1 to induce a temperature rise therein. It is therefore possible also to detect the failure in the bypass diode 15 by covering the solar cell 1 with the light shielding plate 80 and detecting the temperature of such solar cell 1.

According to the present invention, as explained in the foregoing, the temperature of the bypass diode in the solar cell module is detected from the exterior of the solar cell module, and the presence or absence of a failure in the solar cell module is detected based on the result of such temperature detection, so that the failed solar cell module can be searched from the surface of the solar cell. Also the manufacturing cost of the solar cell module can be reduced because the temperature detection means need not be incorporated in advance in the solar cell module. Also the failed solar cell module can be exactly searched from the surface of the solar cell, because the failure is detected by the mutual comparison of the results of temperature detection on the bypass diodes.

Furthermore, since the failed solar cell module is detected by detecting a current flowing in the bypass diode connected to the covered solar cell, it is rendered possible to detect the short circuit failure which could not be detected in the prior art and also to detect a failure in the bypass diode.

Furthermore, the solar cell module of the present invention is provided with the temperature detection means incorporated in the solar cell module and capable of detecting the temperature of the bypass diode and the temperature of the interior of the solar cell module other than the bypass diode, so that the failure in the solar cell module can be exactly detected even in the case of employing the color changing member incorporated in the solar cell module and capable of changing color in response to a temperature change.

Furthermore, as the bypass diode, an ordinary diode can be used, and therefore the forward voltage drop or the power loss can be reduced to minimize the loss in energy, in comparison with a case where the light emitting diode is used.

Furthermore, since the failed solar cell module is detected by the current generated by the solar cell, it is possible to detect the failed solar cell module without interruption of the operation of the power generating system which is required in the conventional case of measuring the terminal voltage of the solar cell module.

Furthermore, as the means for detecting the temperature of the bypass diode and the temperature of the interior of the solar cell module other than the bypass diode, there can be employed a color changing member incorporated in the solar cell module and capable of changing color in response to a temperature change, whereby the failed module can be discovered visually and the work efficiency can be improved.

Furthermore, by providing the vicinity of the bypass diode with the means for preventing the temperature rise resulting from any cause other than a current, it is possible to prevent the temperature rise in the bypass diode which is generated, for example, from the direct sunlight and to securely discriminate the presence or absence of a current flowing in the bypass diode, thereby securely detecting the failed solar cell module.

What is claimed is:

1. A failure detecting method of detecting a failure of a solar cell module, which comprises covering at least on solar cell in a solar cell module with a light shielding plate, detecting a current flowing in a bypass diode bypassing the covered solar cell, and detecting a failed solar cell module based on a result of the current detection.

2. A failure detecting method according to claim 1, wherein the current detection is executed by a light emitting member which emits light by the current.

3. A failure detecting method according to claim 1, wherein the current detection is executed by a light emitting member which emits light by the current.

4. A failure detecting method according to claim 1, wherein the current detection is executed by detecting a temperature of a bypass diode and/or a solar cell in the solar cell module.

5. A failure detecting method according to claim 1, wherein the temperature detection is executed by a temperature detection means of non-contact type.

6. A failure detecting method according to claim 4, wherein the temperature detection is executed by a temperature detection means of contact type.

7. A failure detecting method according to claim 4, wherein the temperature detection is executed by a temperature detection means of visual type.

8. A failure detecting method according to claim 7, wherein the temperature detection is executed by a color changing member for showing a color change in response to a temperature change.

9. A failure detecting method according to claim 8, wherein the color changing member is a color changing member for showing a reversible color change in response to a temperature change.

10. A failure detecting method according to claim 1, wherein the solar cell module comprises, in a vicinity of the bypass diode, means for preventing temperature rise resulting from a cause other than the current.

11. A failure detecting apparatus for detecting a failure in a solar cell module, comprising a light shielding plate for covering a solar cell module or a solar cell in the solar cell module, a current detection means for detecting a current flowing in a bypass diode bypassing the solar cell module or the solar cell, and means for detecting a failed solar cell module based on an output of the current detection means.

12. A failure detecting apparatus according to claim 11, wherein the current detection means is means for detecting a current by a magnetic force generated by the current.

13. A failure detecting apparatus according to claim 11, wherein the current detection means is means for detecting a current by a light emitting member which emits light by the current.

14. A failure detecting apparatus according to claim 11, wherein the current detection means comprises means for detecting a temperature of the bypass diode and/or a solar cell in the solar cell module.

15. A failure detecting apparatus according to claim 14, wherein the temperature detection means is of non-contact type.

16. A failure detecting apparatus according to claim 14, wherein the temperature detection means is of contact type.

17. A failure detecting apparatus according to claim 14, wherein the temperature detection means is a visual temperature detection means.

18. A failure detecting apparatus according to claim 17, wherein the temperature detection means is a color changing member for showing a color change in response to a temperature change.

19. A failure detecting apparatus according to claim 18, wherein the color changing member is a member for showing a reversible color change in response to a temperature change.

* * * * *

UNITED STATES PATENT AND TRADEMARK OFFICE
CERTIFICATE OF CORRECTION

PATENT NO. : 6,512,458 B1
DATED : January 28, 2003
INVENTOR(S) : Takuma Kobayashi et al.

It is certified that error appears in the above-identified patent and that said Letters Patent is hereby corrected as shown below:

<u>Column 9,</u>
Line 66, "on solar" should read -- one solar --.

<u>Column 10,</u>
Line 5, "a light emitting" should be deleted;
Line 6, "member which emits light" should read -- detecting a magnetic force generated --; and
Line 13, "claim 1," should read -- claim 4, --.

Signed and Sealed this

Ninth Day of December, 2003

JAMES E. ROGAN
*Director of the United States Patent and Trademark Office*